United States Patent
Walker et al.

(10) Patent No.: US 12,412,703 B2
(45) Date of Patent: Sep. 9, 2025

(54) STAND OFF STRUCTURES FOR ELECTRONIC CIRCUITS

(71) Applicant: KROMEK LIMITED, Sedgefield (GB)

(72) Inventors: Franklin Dean Walker, San Dimas, CA (US); Scott William Thompson, Cranberry Township, PA (US); Mark Anthony Parral, Apple Valley, CA (US)

(73) Assignee: KROMEK LIMITED, Sedgefield (GB)

( * ) Notice: Subject to any disclaimer, the term of this patent is extended or adjusted under 35 U.S.C. 154(b) by 388 days.

(21) Appl. No.: 17/979,473

(22) Filed: Nov. 2, 2022

(65) Prior Publication Data

US 2023/0135363 A1    May 4, 2023

Related U.S. Application Data

(60) Provisional application No. 63/275,002, filed on Nov. 3, 2021.

(51) Int. Cl.
| | |
|---|---|
| *H01G 4/232* | (2006.01) |
| *H05K 1/02* | (2006.01) |
| *H05K 1/14* | (2006.01) |
| *H05K 3/34* | (2006.01) |

(52) U.S. Cl.
CPC ........... *H01G 4/232* (2013.01); *H05K 1/0231* (2013.01); *H05K 1/145* (2013.01); *H05K 3/3447* (2013.01)

(58) Field of Classification Search
CPC ...... H01G 4/232; H05K 1/0231; H05K 1/145; H05K 3/3447

USPC ..................................................... 439/620.09
See application file for complete search history.

(56) References Cited

U.S. PATENT DOCUMENTS

| | | | | |
|---|---|---|---|---|
| 7,514,688 | B2* | 4/2009 | Broennimann | H04N 25/773 |
| | | | | 250/370.11 |
| 7,633,739 | B2* | 12/2009 | Devoe | H01G 4/30 |
| | | | | 361/308.1 |
| 8,988,857 | B2* | 3/2015 | McConnell | H01G 2/06 |
| | | | | 361/306.3 |
| 2006/0245308 | A1 | 11/2006 | Macropoulos et al. | |

(Continued)

FOREIGN PATENT DOCUMENTS

| | | | | |
|---|---|---|---|---|
| DE | 102013102278 A1 * | 9/2014 | .......... | H01G 4/1209 |
| WO | WO-2017090460 A1 * | 6/2017 | ............... | H05K 1/11 |
| WO | WO2020063681 A1 | 4/2020 | | |

OTHER PUBLICATIONS

ISA/EP, European Patent Office, International Search Report, Feb. 28, 2023, 14 pages, European Patent Office.

*Primary Examiner* — Peter G Leigh
(74) *Attorney, Agent, or Firm* — FERENCE & ASSOCIATES LLC

(57) ABSTRACT

One embodiment provides an electronic circuit device, including: a first electronic circuit board; a second electronic circuit board separated from the first electronic circuit board; at least one capacitor including two electrodes, wherein one of the two electrodes is mounted to the first electronic circuit board and wherein the other of the two electrodes is mounted to the second electronic circuit board; and at least one connector electrically coupled to at least one of the first electronic circuit board and the second electronic circuit board. Other aspects are described and claimed.

18 Claims, 3 Drawing Sheets

(56) References Cited

U.S. PATENT DOCUMENTS

| | | | |
|---|---|---|---|
| 2007/0188975 A1* | 8/2007 | Togashi | H05K 3/3426 |
| | | | 361/306.3 |
| 2013/0146347 A1* | 6/2013 | McConnell | H05K 3/303 |
| | | | 361/301.4 |
| 2017/0025223 A1* | 1/2017 | Bultitude | B23K 1/008 |
| 2017/0178819 A1* | 6/2017 | Wang | H01G 4/385 |
| 2018/0047711 A1 | 2/2018 | Chiu et al. | |
| 2019/0335585 A1 | 10/2019 | Thollin | |
| 2021/0227693 A1 | 7/2021 | Bultitude et al. | |

* cited by examiner

STAND OFF STRUCTURES FOR ELECTRONIC CIRCUITS

CROSS REFERENCE TO RELATED APPLICATION

This application claims priority to U.S. Provisional Patent Application Ser. No. 63/275,002, filed on Nov. 3, 2021, and entitled "STAND OFF STRUCTURES FOR ELECTRONIC CIRCUITS," the contents of which are incorporated by reference herein.

FIELD

This application relates generally to electronics, and, more particularly, to decreasing electrical noise in electronics.

BACKGROUND

Electronics are used as in many different applications from simple children's toys to complex assemblies. Circuit boards are utilized in many of these applications in order to condense an electronic circuit, thereby allowing for a neater installation and a reduction in size as compared to electronic circuits created without the use of circuit boards. Circuit boards can be designed for a specific application or may be designed to allow for some customization based upon the end application. The design of a circuit board can influence different attributes of the circuit, for example, response times, electronic noise within the circuit, ease of installation, a number of inputs and or outputs, and the like. Thus, the circuit board may be designed in view of these attributes with respect to the final application that the circuit board will be used within.

BRIEF SUMMARY

In summary, one aspect provides an electronic circuit device, including: a first electronic circuit board; a second electronic circuit board separated from the first electronic circuit board; at least one capacitor including two electrodes, wherein one of the two electrodes is mounted to the first electronic circuit board and wherein the other of the two electrodes is mounted to the second electronic circuit board; and at least one connector electrically coupled to at least one of the first electronic circuit board and the second electronic circuit board.

Another aspect provides a product, including: an assembly; an electronic circuit device electrically coupled to the assembly, the electronic circuit device including: a first electronic circuit board; a second electronic circuit board separated from the first electronic circuit board; at least one capacitor including two electrodes, wherein one of the two electrodes is mounted to the first electronic circuit board and wherein the other of the two electrodes is mounted to the second electronic circuit board; and at least one connector electrically coupled to at least one of the first electronic circuit board and the second electronic circuit board.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

DETAILED DESCRIPTION

Figure 1:
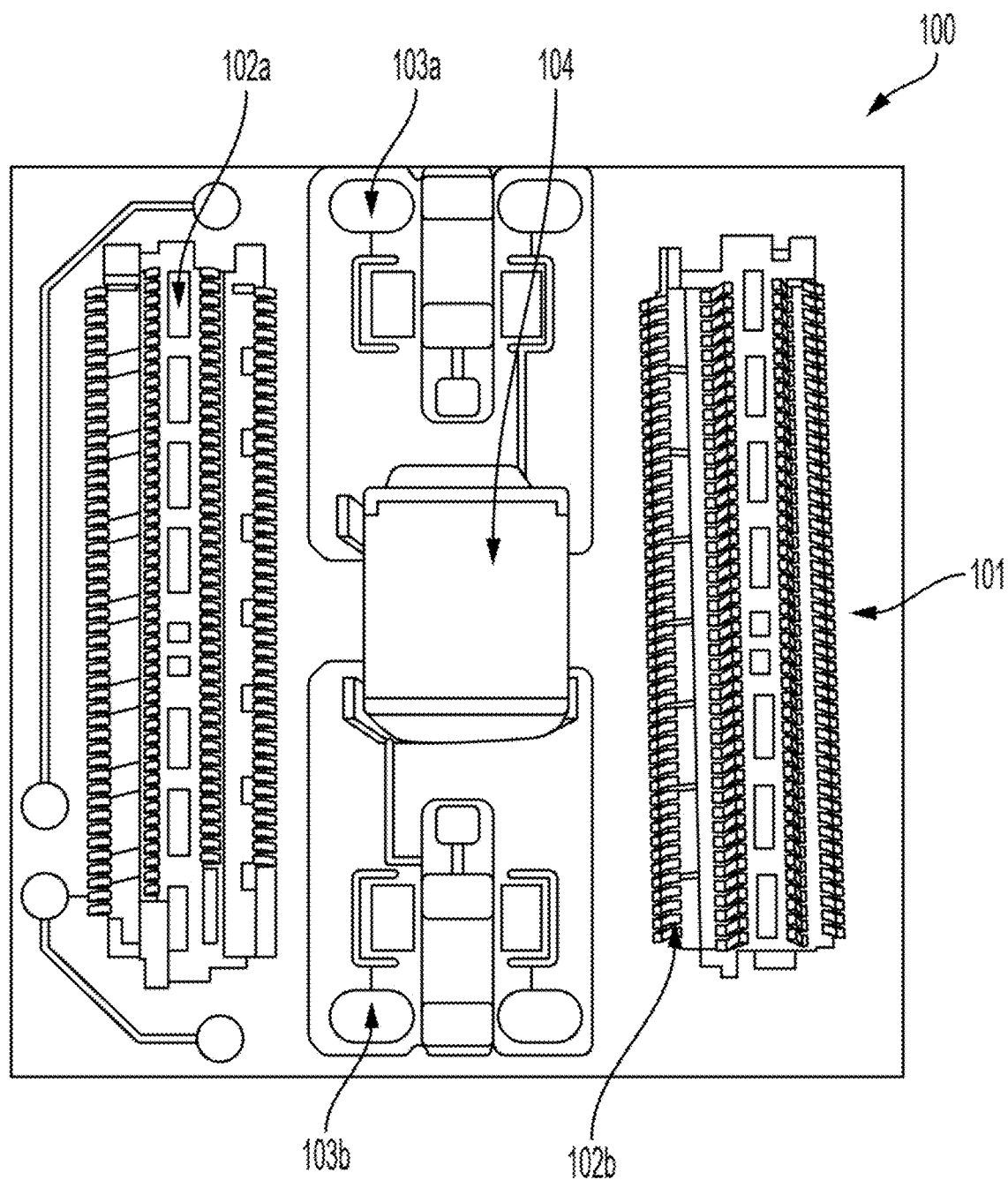
FIG. 1 illustrates an example electronic circuit device top view.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

Different applications of circuit boards require different design considerations. For example, a circuit board that is being used within an application that is sensitive to charge needs to be designed to reduce the amount of charge that is seen at one or more components of the circuit board and/or application. This is especially true in applications that utilize high voltages since these applications result in high charges. High-voltage applications introduce high charges which result in charge noise at different components of the circuit board, for example, the connectors, which introduces noise into the entire application which may reduce the functionality of the application or even prevent it from working completely. Even small amounts of charge noise in charge sensitive electronics can degrade the sensitivity of a circuit, which may result in permanently damaged electrical circuit components.

The geometry of an electrical circuit board may influence how much noise is seen at a particular component of the electrical circuit. Charge noise from leakage of the electrical charge can travel from one component of the electronic circuit board to another component on the circuit board even without direct connections between the two components. The noise can travel along the surface of the board and, thus, be introduced to other components on the board. This is how the geometry of the board can affect how much noise is seen at a particular location on the board. This distance in which a charge travels between components on a circuit board is known as the creepage distance. Creepage distance is measured along the surface of a circuit board. Accordingly, as the charge traverses the surface of the circuit board, it will lessen. Thus, components that are further from the component introducing the charge noise will see less of the charge noise. However, in most applications there is a desire for an electronic circuit board having a small footprint so that the size of the entire application does not need to be increased to accommodate a large circuit board.

One technique to reduce the charge noise is to design the circuit board so that the component which introduces the charge noise is as far from a component that is sensitive to the charge noise as possible. However, this is constrained by the size of the board and it may not be possible to place the components apart on the board depending on the components required for the circuit. Another technique to reduce the amount of charge noise seen at sensitive components is through the use of an insulator, such as a high-resistance non-conductive epoxy, to encapsulate the circuit. The encapsulant minimizes the ability of the charge noise to traverse the board into other components. However, encapsulants have many drawbacks, for example, the inability to rework or repair a circuit, the inability to add components at a later time, a reduction in the ability to troubleshoot a non-working circuit, messiness, it could cause damage to a circuit, increases the noise floor due to the unavoidable leakage of charge through the insulator, and the like.

Accordingly, an embodiment provides an electronic circuit device, board, or system, that reduces an amount of charge noise seen at sensitive components based upon a geometry of the board without the use of encapsulants while still allowing a small footprint for the circuit board. By eliminating the need for encapsulants, the described device does not suffer from any of the drawbacks of utilizing encapsulants as described herein. The design of the board allows for the use of the board in high-voltage applications that produce charge noise while decreasing or eliminating the voltage gradient across the board, thereby reducing or eliminating the charge noise seen at the sensitive component(s) of the board. The board is designed to use two circuit boards that are separated from each other by a distance. Each of the two electrodes of a capacitor, which is the component producing the charge noise, is mounted to one of the circuit boards. A connector, which is electrically coupled to one of the circuit boards and is sensitive to the charge noise, is mounted on a portion of the circuit board away from the capacitor, for example, on a substrate to which the circuit boards are also mounted. Since each electrode of the capacitor is mounted to a different board, the creepage distance is significantly increased since the charge gradient has to traverse the circuit boards before reaching the connector, thereby reducing or eliminating the charge gradient before it reaches the connector.

The illustrated example embodiments will be best understood by reference to the figures. The following description is intended only by way of example, and simply illustrates certain example embodiments.

Conventional circuit boards are manufactured utilizing a two-dimensional process, meaning the circuit board has a top and bottom and components may be mounted on either or both sides. The two-dimensional process means that other circuit boards are not also mounted on the circuit board as part of the electronic circuit. With a two-dimensional board, a charge path is traced on the surface of the circuit board, which makes it dependent on the two dimensions of the board, length and width. To help reduce the charge noise the circuit may be designed with the charge producing component on one side of the board and the charge sensitive component on the other side of the board, which means that the charge path distance includes the thickness of the board. However, circuit boards are frequently designed so that traces for components are included on the opposite side of the board as the component. This means that the charge gradient does not need to reach the component itself, which is on the opposite side of the board, but could instead reach one of the traces which would then introduce the charge gradient to the charge sensitive component.

Thus, in the described device, a two-and-a-half-dimensional (2.5D) process or structure is utilized to increase the creepage distance while still maintaining a small overall footprint. A 2.5D process or structure means that multiple 2D boards are "stacked" on top of each other, rather than a true 3D process or structure. In other words, the circuit boards are layered on top of each other which may include having a distance between the layers, for example, through the use of spacers, connecting or manufacturing compounds or adhesives, standoffs, or the like. This increases the creepage distance, thereby reducing the voltage gradient, or electrical potential, across the circuit board. Thus, such a system is useful in a high-voltage application where the high voltage results in a charge noise at noise sensitive components.

Figure 2:
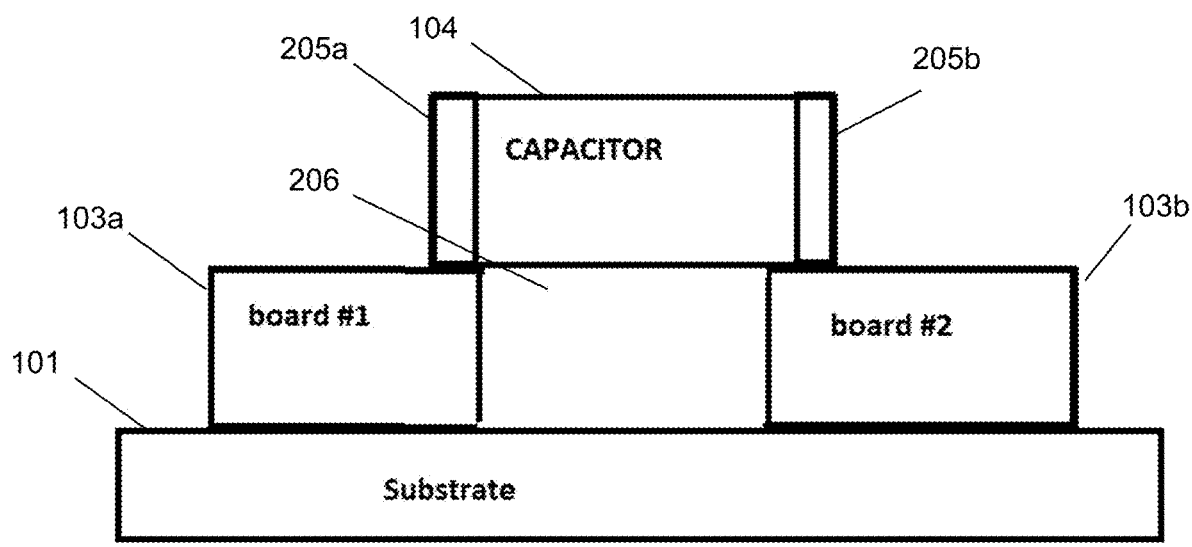
FIG. 2 illustrates an example electronic circuit device block diagram side view.

FIG. 1 illustrates an example top view of electronic circuit device 100 described herein. It should be understood that the example in FIG. 1 (and FIG. 2) is merely an example and other components may be included, components may be removed, the circuit may be of a different size, the circuit may be more simple or complex, or the like. The example of FIG. 1 and FIG. 2 is merely illustrative of the concept described herein.

The example electronic circuit device 100 of FIG. 1 includes two electronic circuit boards 103a and 103b, a capacitor 104, and two connectors 102a and 102b. This example includes a substrate 101 to which the connectors 102a and 102b are attached. In this example, the capacitor 104 is the charge producing component and the connectors 102a and 102b are the charge sensitive components. Thus, the creepage distance is measured between the capacitor 104 and the connectors 102a and 102b. In the example of FIG. 1, the electronic circuit boards 103a and 103b are mini electronic circuit boards, referred to as miniboards, meaning they are smaller than a traditional circuit board and include only a portion of the components that are necessary for performing the function of the electronic circuit device 100.

The capacitor 104 has two electrodes. Each electrode is mounted to one of the circuit boards 103a and 103b. Thus, one side of the capacitor 104 is mounted to one of the circuit boards 103a and 103b and the other side of the capacitor 104 is mounted to the other of the circuit boards 103a and 103b. This can be better seen in the block diagram side view of the electronic circuit device 100 of FIG. 2. Each electrode 205a and 205b of the capacitor 104 is mounted to one of the circuit boards 103a and 103b. This creates a space or distance 206 between the two circuit boards 103a and 103b. Thus, the capacitor 104 traverses the separation or space 206 between the two circuit boards 103a and 103b. This space can also be seen in FIG. 1, but is better illustrated in FIG. 2. It should be noted that the components in FIG. 2 that represent the same components in FIG. 1 utilize the same reference numbers. The two circuit boards 103a and 103b may be identical or matching boards. One of the circuit boards 103a and 103b may be turned 180 degrees, in the same plane, from the other of the circuit boards 103a and 103b.

The electronic circuit device 100 may include one or more connectors 102a and 102b. The connector(s) 102a and 102b may be electrically coupled to at least one of the circuit boards 103a and 103b. The connector(s) 102a and 102b may be mechanically coupled to the substrate 101. In other words, the connector(s) 102a and 102b may be mounted on or otherwise attached to the substrate 101, which makes them on a separate board than the capacitor 104, thereby increasing the creepage distance between the capacitor 104 and the connector(s) 102a and 102b.

The two circuit boards 103a and 103b may be mechanically coupled to the substrate 101, for example, using non-conductive adhesive, as a single piece during manufacturing, using electronic connectors, or the like. The coupling may also include the use of standoffs, spacers, or other components that increase the distance between the circuit boards 103a and 103b and the substrate. Not only can the circuit boards 103a and 103b be mounted to the substrate 101 including standoffs, spacers, or the like, but the circuit boards 103a and 103b, themselves act as standoffs for the capacitor 104. Thus, the circuit boards 103a and 103b and capacitor 104 are attached to the substrate 101 in a type of stacking method and creates a suspended structure.

Through the use of the stacking method and the use of the circuit boards 103a and 103b as standoffs and any other standoffs or spacers that are utilized, the voltage gradient across the circuit is substantially decreased. In other words, the suspended structure design increases the creepage distance between the two electrodes of the capacitor and the connector(s) which, in turn, results in the voltage gradient produced by the capacitor to be reduced or eliminated at the connector, thereby reducing or eliminating the charge noise at the connector. As stated previously, the creepage distance is the shortest distance that a charge travels across a surface between a charge producing component (e.g., the capacitor in the example of FIG. 1 and FIG. 2) and a charge sensitive component (e.g., the connector(s) in the example of FIG. 1 and FIG. 2). Since the charge travels along the surface of the circuit board, meaning it cannot travel through the board, the creepage distance is measured across the surface of the circuit board. The suspended structure increases the creepage distance by leveraging the thicknesses of the boards and any other components in the creepage path and the dimension of the boards.

As stated previously, the devices illustrated in FIG. 1 and FIG. 2 are merely examples. Accordingly, the devices may include additional electronic components that are not illustrated in FIG. 1 and/or FIG. 2. The devices may include additional components (e.g., resistors, other capacitors, transistors, clocks, inductors, transducers, controllers, other connectors, etc.) that are mounted to one or more of the circuit boards 103a and 103b and/or the substrate 101.

The electronic circuit device may be included in a product that has an assembly additional to the electronic circuit device. For example, the circuit device may be used in a detector application that includes a photon detector assembly in addition to the circuit devices. As another example, the circuit device may be used in a power distribution application that includes power distribution components or assemblies in addition to the circuit devices. The circuit devices may be electrically coupled to the assembly or at least a portion of the assembly. The geometry of the electronic device may provide additional benefits to the product, for example, allowing easier access to the connectors of the electronic circuit device(s), allowing for a more efficient design of the product by not requiring that one side of the device remain open to access the connectors, and the like.

Figure 3:
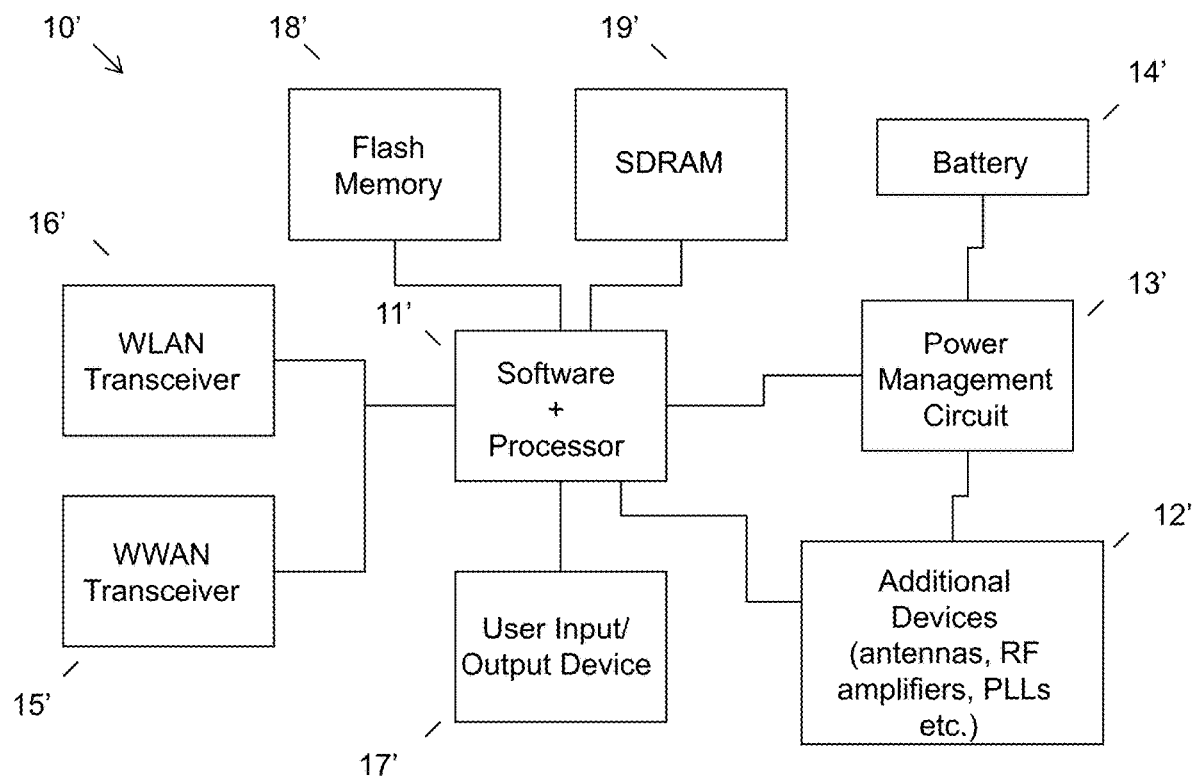
FIG. 3 illustrates an example of information handling device circuitry.

The described circuit device may be utilized in various information handling devices; an example is illustrated in FIG. 3. Device circuitry 10' may include a measurement system on a chip design found, for example, a particular computing platform (e.g., mobile computing, desktop computing, etc.) Software and processor(s) are combined in a single chip 11'. Processors comprise internal arithmetic units, registers, cache memory, busses, I/O ports, etc., as is well known in the art. Internal busses and the like depend on different vendors, but essentially all the peripheral devices (12') may attach to a single chip 11'. The circuitry 10' combines the processor, memory control, and I/O controller hub all into a single chip 11'. Also, systems 10' of this type do not typically use SATA or PCI or LPC. Common interfaces, for example, include SDIO and I2C.

There are power management chip(s) 13', e.g., a battery management unit, BMU, which manage power as supplied, for example, via a rechargeable battery 14', which may be recharged by a connection to a power source (not shown). In at least one design, a single chip, such as 11', is used to supply BIOS like functionality and DRAM memory.

System 10' typically includes one or more of a WWAN transceiver 15' and a WLAN transceiver 16' for connecting to various networks, such as telecommunications networks and wireless Internet devices, e.g., access points. Additionally, devices 12' are commonly included, e.g., a transmit and receive antenna, oscillators, PLLs, etc. System 10' includes input/output devices 17' for data input and display/rendering (e.g., a computing location located away from the single beam system that is easily accessible by a user). System 10' also typically includes various memory devices, for example flash memory 18' and SDRAM 19'.

It can be appreciated from the foregoing that electronic components of one or more systems or devices may include, but are not limited to, at least one processing unit, a memory, and a communication bus or communication means that couples various components including the memory to the processing unit(s). A system or device may include or have access to a variety of device readable media. System memory may include device readable storage media in the form of volatile and/or nonvolatile memory such as read only memory (ROM) and/or random access memory (RAM). By way of example, and not limitation, system memory may also include an operating system, application programs, other program modules, and program data. The disclosed system may be used in an embodiment of an instrument for determining a characteristic of an electron cloud upon a subset of pixels.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

As will be appreciated by one skilled in the art, various aspects may be embodied as a system, method or device program product. Accordingly, aspects may take the form of an entirely hardware embodiment or an embodiment including software that may all generally be referred to herein as a "circuit," "module" or "system." Furthermore, aspects may take the form of a device program product embodied in one or more device readable medium(s) having device readable program code embodied therewith.

It should be noted that the various functions described herein may be implemented using instructions stored on a device readable storage medium such as a non-signal storage device, where the instructions are executed by a processor. In the context of this document, a storage device is not a signal and "non-transitory" includes all media except signal media.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

It should be noted that the various functions described herein may be implemented using instructions stored on a device readable storage medium such as a non-signal storage device that are executed by a processor. A storage device may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a storage device is not a signal and "non-transitory" includes all media except signal media.

Program code embodied on a storage medium may be transmitted using any appropriate medium, including but not limited to wireless, wireline, optical fiber cable, RF, et cetera, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), or the connection may be made through other devices (for example, through the Internet using an Internet Service Provider), through wireless connections, e.g., near-field communication, or through a hard wire connection, such as over a USB connection.

Example embodiments are described herein with reference to the figures, which illustrate example methods, devices and program products according to various example embodiments. It will be understood that the actions and functionality may be implemented at least in part by program instructions. These program instructions may be provided to a processor of a device, a special purpose information handling device, or other programmable data processing device to produce a machine, such that the instructions, which execute via a processor of the device implement the functions/acts specified.

It is noted that the values provided herein are to be construed to include equivalent values as indicated by use of the term "about." The equivalent values will be evident to those having ordinary skill in the art, but at the least include values obtained by ordinary rounding of the last significant digit.

It is worth noting that while specific blocks are used in the figures, and a particular ordering of blocks has been illustrated, these are non-limiting examples. In certain contexts, two or more blocks may be combined, a block may be split into two or more blocks, or certain blocks may be re-ordered or re-organized as appropriate, as the explicit illustrated examples are used only for descriptive purposes and are not to be construed as limiting.

As used herein, the singular "a" and "an" may be construed as including the plural "one or more" unless clearly indicated otherwise.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. An electronic circuit device, comprising:
    a first electronic circuit board;
    a second electronic circuit board separated from the first electronic circuit board;
    at least one capacitor comprising two electrodes, wherein one of the two electrodes is mounted to the first electronic circuit board and wherein the other of the two electrodes is mounted to the second electronic circuit board; and
    at least one connector electrically coupled to at least one of the first electronic circuit board and the second electronic circuit board;
    wherein the first electronic circuit board, the second electronic circuit board, the at least one capacitor, and the at least one connector are mechanically coupled creating a suspended structure, thereby increasing the creepage distance between the two electrodes and the at least one connector such that an electrical voltage gradient produced by the at least one capacitor is reduced at the at least one connector.

2. The electronic circuit device of claim 1, wherein each of the first electronic circuit board and the second electronic circuit board comprise mini electronic circuit boards.

3. The electronic circuit device of claim 1, comprising a substrate, wherein the at least one connector is mechanically coupled to the substrate.

4. The electronic circuit device of claim 3, wherein each of the first electronic circuit board and the second electronic circuit board are mechanically coupled to the substrate.

5. The electronic circuit device of claim 3, comprising electronic components other than the at least one capacitor and wherein the electronic components are mechanically coupled to the substrate.

6. The electronic circuit device of claim 1, wherein the first electronic circuit board and the second electronic circuit board comprise matching circuit boards.

7. The electronic circuit device of claim 1, wherein the second electronic circuit board is turned 180 degrees in the same plane from the first electronic circuit board.

8. The electronic circuit device of claim 1, wherein at least one of the first electronic circuit board and the second electronic circuit board comprise electronic components other than the at least one capacitor.

9. The electronic circuit device of claim 1, wherein the at least one capacitor traverses the separation between the first electronic circuit board and the second electronic circuit board.

10. A product, comprising:
an assembly;
an electronic circuit device electrically coupled to the assembly, the electronic circuit device comprising:
a first electronic circuit board;
a second electronic circuit board separated from the first electronic circuit board;
at least one capacitor comprising two electrodes, wherein one of the two electrodes is mounted to the first electronic circuit board and wherein the other of the two electrodes is mounted to the second electronic circuit board; and
at least one connector electrically coupled to at least one of the first electronic circuit board and the second electronic circuit board;
wherein the first electronic circuit board, the second electronic circuit board, the at least one capacitor, and the at least one connector are mechanically coupled creating a suspended structure, thereby increasing the creepage distance between the two electrodes and the at least one connector such that an electrical voltage gradient produced by the at least one capacitor is reduced at the at least one connector.

11. The product of claim 10, wherein each of the first electronic circuit board and the second electronic circuit board comprise mini electronic circuit boards.

12. The product of claim 10, comprising a substrate, wherein the at least one connector is mechanically coupled to the substrate.

13. The product of claim 12, wherein each of the first electronic circuit board and the second electronic circuit board are mechanically coupled to the substrate.

14. The product of claim 10, wherein the first electronic circuit board and the second electronic circuit board comprise matching circuit boards.

15. The product of claim 10, wherein the second electronic circuit board is turned 180 degrees in the same plane from the first electronic circuit board.

16. The product of claim 10, wherein at least one of the first electronic circuit board and the second electronic circuit board comprise electronic components other than the at least one capacitor.

17. The product of claim 10, wherein the at least one capacitor traverses the separation between the first electronic circuit board and the second electronic circuit board.

18. The product of claim 10, wherein the assembly comprises a photon detector assembly.

* * * * *